United States Patent
Sun et al.

(10) Patent No.: US 12,176,364 B2
(45) Date of Patent: Dec. 24, 2024

(54) PASSIVATION-ENHANCED IMAGE SENSOR AND SURFACE-PASSIVATION METHOD

(71) Applicant: OmniVision Technologies, Inc., Santa Clara, CA (US)

(72) Inventors: Shiyu Sun, Cupertino, CA (US); Yuanwei Zheng, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 457 days.

(21) Appl. No.: 17/562,577

(22) Filed: Dec. 27, 2021

(65) Prior Publication Data
US 2023/0207589 A1   Jun. 29, 2023

(51) Int. Cl.
*H01L 27/146* (2006.01)

(52) U.S. Cl.
CPC .... *H01L 27/1462* (2013.01); *H01L 27/14632* (2013.01); *H01L 27/14685* (2013.01); *H01L 27/14698* (2013.01)

(58) Field of Classification Search
CPC ............ H01L 27/1462; H01L 27/1463; H01L 27/14632
See application file for complete search history.

(56) References Cited

U.S. PATENT DOCUMENTS

| | | | |
|---|---|---|---|
| 9,704,904 B2 * | 7/2017 | Lai | H01L 27/1464 |
| 9,859,323 B1 * | 1/2018 | Chen | H01L 27/1462 |
| 10,163,949 B2 * | 12/2018 | Lai | H01L 27/14654 |
| 10,304,886 B2 * | 5/2019 | Chiang | H01L 27/1464 |
| 11,329,086 B2 * | 5/2022 | Liu | H01L 27/14636 |
| 11,670,648 B2 * | 6/2023 | Liu | H01L 27/1461 |
| | | | 348/226.1 |
| 11,695,030 B2 * | 7/2023 | Mun | H01L 27/14627 |
| | | | 257/432 |
| 12,080,747 B2 * | 9/2024 | Uchida | H01L 27/14643 |
| 2018/0076252 A1 * | 3/2018 | Togashi | H01L 27/14607 |
| 2018/0219040 A1 * | 8/2018 | Choi | H01L 27/14621 |
| 2019/0081191 A1 * | 3/2019 | Manda | H01L 27/14623 |
| 2019/0096951 A1 * | 3/2019 | Cheng | H01L 27/14632 |
| 2019/0109162 A1 * | 4/2019 | Lai | H01L 27/1464 |

(Continued)

OTHER PUBLICATIONS

Hu et al., "Metal/III-V effective barrier height tuning using atomic layer deposition of high-κ/ high-κbilayer interfaces", Applied Physics Letters, 99, 092107, 2011, 4 pages.

(Continued)

*Primary Examiner* — Mounir S Amer
*Assistant Examiner* — Alexander Belousov
(74) *Attorney, Agent, or Firm* — COZEN O'CONNOR

(57) ABSTRACT

An image sensor includes a semiconductor substrate and a multilayer film. The semiconductor substrate includes a photodiode and a back surface having a recessed region that surrounds the photodiode. The multilayer film is on, and conformal to, the recessed region, and includes N layer-groups of adjacent high-κ material layers. Each pair of adjacent high-κ material layers of a same layer-group of the N layer-groups includes (i) an outer-layer having an outer fixed-charge density and (ii) an inner-layer, located between the outer-layer and the recessed region, that has an inner fixed-charge density. Each of the outer and inner fixed-charge density is negative. The inner fixed-charge density is more negative than the outer fixed-charge density.

19 Claims, 8 Drawing Sheets

(56) References Cited

U.S. PATENT DOCUMENTS

| | | | | |
|---|---|---|---|---|
| 2021/0202546 A1* | 7/2021 | Liu | .................... | H01L 27/1463 |
| 2022/0005851 A1* | 1/2022 | Uchida | ............... | H01L 27/1463 |
| 2022/0173143 A1* | 6/2022 | Kim | .................. | H01L 27/14614 |
| 2022/0190009 A1* | 6/2022 | Liu | .................... | H01L 27/14605 |
| 2022/0208827 A1* | 6/2022 | Mun | ................. | H01L 27/14621 |
| 2022/0238571 A1* | 7/2022 | Park | ................. | H01L 27/14685 |
| 2023/0092590 A1* | 3/2023 | Park | .................... | H01L 27/1463 |
| | | | | 257/432 |
| 2023/0154960 A1* | 5/2023 | Du | .................... | H01L 27/14627 |
| | | | | 257/446 |
| 2023/0207589 A1* | 6/2023 | Sun | ................... | H01L 27/14632 |
| | | | | 257/443 |
| 2023/0223416 A1* | 7/2023 | Mun | ................ | H01L 27/14623 |
| | | | | 257/432 |
| 2023/0307696 A1* | 9/2023 | Sei | ...................... | H01M 10/052 |
| 2024/0258348 A1* | 8/2024 | Ooki | .................. | H01L 27/14685 |
| 2024/0290813 A1* | 8/2024 | Haneda | ................ | H01L 21/768 |

OTHER PUBLICATIONS

Chen et al. "Ab Initio Study of Dipole-induced Threshold Voltage Shift in HfO2/Al2O3/(100)Si", IEEE 2014, 3 pages.

B. Hoex et al. "On the c-Si surface passivation mechanism by the negative-charge-dielectric Al2O3" Journal of Applied Physics, 104, 113703, 2008, 8 pages.

Oudot, "Oxydes métalliques pour la passivation de l'interface Si / SiO2 des capteurs d'images CMOS", Université Grenoble Alpes, 2018, 235 pages.

\* cited by examiner

910
Deposit a multilayer film on a surface, the multilayer film including $N$ layer-groups of adjacent high-κ material layers. Each pair of adjacent high-κ material layers of a same layer-group of the $N$ layer-groups includes (i) an outer-layer having an outer fixed-charge density and (ii) an inner-layer, located between the outer-layer and the recessed region, and having an inner fixed-charge density.
Each of the outer and inner fixed-charge density is negative. The inner fixed-charge density is more negative than the outer fixed-charge density.

912
Forming a first layer-group of the $N$ layer groups by (i) depositing a first high-κ material layer on the surface, (ii) depositing a second high-κ material layer directly on the first layer, and depositing a third high-κ material layer directly on the second layer.

915
Form a first layer-group of the $N$ layer groups by (i) depositing a first high-κ material layer on the surface and (ii) depositing a second high-κ material layer directly on the first layer.

917
Form a second layer-group of the $N$ layer groups by (i) depositing a third high-κ material layer on the second layer and (ii) depositing a fourth high-κ material layer directly on the third layer

FIG. 9

PASSIVATION-ENHANCED IMAGE SENSOR AND SURFACE-PASSIVATION METHOD

BACKGROUND

Camera modules in commercial products such as stand-alone digital cameras, mobile devices, automotive components, and medical devices include an image sensor. One type of image sensor is a complementary metal-oxide-semiconductor (CMOS) image sensor, which includes a semiconductor substrate that has a pixel array formed therein. Images produced by CMOS image sensors may include artifacts, some of which are caused by one or both of electrical cross-talk and optical cross-talk between adjacent pixels of the pixel array. Measures to reduce such cross-stalk can result in introducing other image artifacts.

SUMMARY OF THE EMBODIMENTS

In some CMOS image sensors, each pixel formed in a semiconductor substrate is optically and electrically isolated from neighboring pixels by a deep trench isolation (DTI) structure formed in a trench that both surrounds the photodiode of the pixel and includes a plurality of DTI trenches formed in a surface of the semiconductor substrate. The trench results from etching part of a back surface of the semiconductor substrate, which yields a recessed region that defines the trench. This etching creates defects on the recessed region, which increases dark current detected by a pixel near the defects. For example, plasma etching causes defects by damaging the semiconductor lattice such that the recessed surface includes dangling bonds and/or charge trap sites. The increased dark current results in "white pixel" defects, in which a pixel outputs a large signal regardless of illumination thereon. The white pixel defects degrade image quality.

High-κ dielectric films on the recessed region and back surface passivate these surfaces; which reduces white pixel defects. The present embodiments include multilayer films where relative charge densities of adjacent layers result in dipoles at the interface of the adjacent layers. The electric dipole moment of each dipole points away from the recessed surface. That is, the negative end of each dipole is closer to the recessed region, and hence is between the recessed region and the dipole's positive end. The negative end of the dipole attracts holes in the semiconductor substrate to the recessed region. This diffusion of holes reduces the height of the electric-potential barrier at the interface of the semiconductor substrate (recessed region) and the multilayer film. The reduced barrier height induces electron tunneling from the semiconductor substrate toward a dielectric filling material on the recess region, which increases hole density in the induced hole accumulation region surrounding recession region, and hence enhances passivation around the recessed region.

In a first aspect, an image sensor includes a semiconductor substrate and a multilayer film. The semiconductor substrate includes a photodiode and a back surface having a recessed region that surrounds the photodiode. The multilayer film is on, and conformal to, the recessed region, and includes N layer-groups of adjacent high-κ material layers. Each pair of adjacent high-κ material layers of a same layer-group of the N layer-groups includes (i) an outer-layer having an outer fixed-charge density and (ii) an inner-layer, located between the outer-layer and the recessed region, that has an inner fixed-charge density. Each of the outer and inner fixed-charge density is negative. The inner fixed-charge density is more negative than the outer fixed-charge density.

In a second aspect, surface passivation method comprising depositing, on a surface, the multilayer film of the first aspect.

BRIEF DESCRIPTION OF THE FIGURES

FIG. 9 is a flowchart illustrating a surface passivation method, in an embodiment.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed of one or more semiconductors such as silicon, silicon-germanium, germanium, gallium arsenide, indium gallium arsenide, III-V group of compounds, and other semiconductor materials known to those of skill in the art.

The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate. It should be noted that element names and symbols may be used interchangeably through this document (e.g., Si vs. silicon); both have identical meanings.

Figure 1:
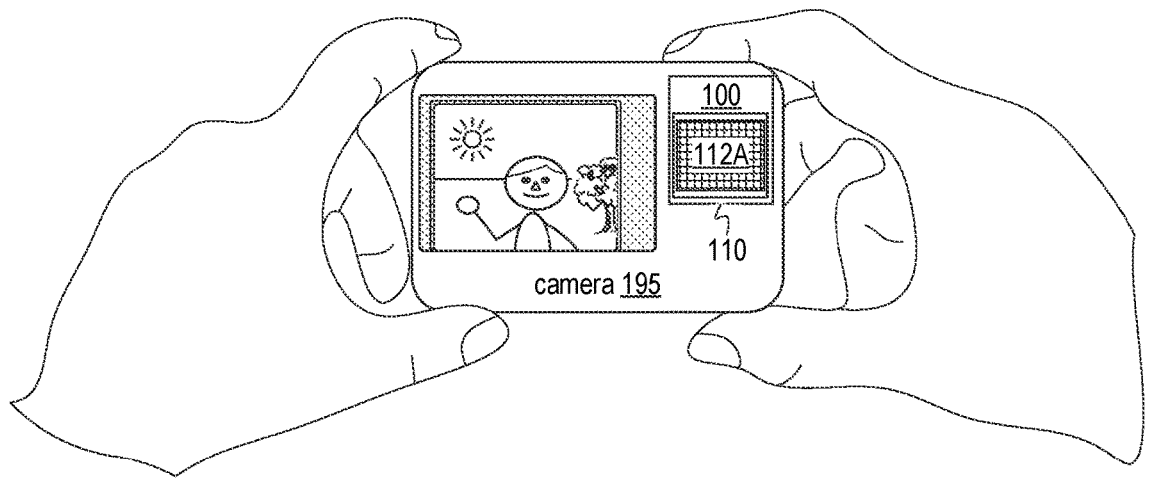
FIG. 1 depicts a camera imaging a scene; the camera includes an image sensor.

FIG. 1 depicts a camera 195 imaging a scene. Camera 195 includes an image sensor 100, which includes a semiconductor substrate 110. Constituent elements of semiconductor substrate 110 may include at least one of silicon and germanium. Semiconductor substrate 110 includes a pixel array 112A. Image sensor 100 may be part of a chip-scale package or a chip-on-board package. Camera 195 is shown as a component of a handheld device, but it should be appreciated that other devices, such as security devices, automobile cameras, drone cameras, endoscope, etc. may utilize camera 195 without departing from the scope hereof.

Figure 2:
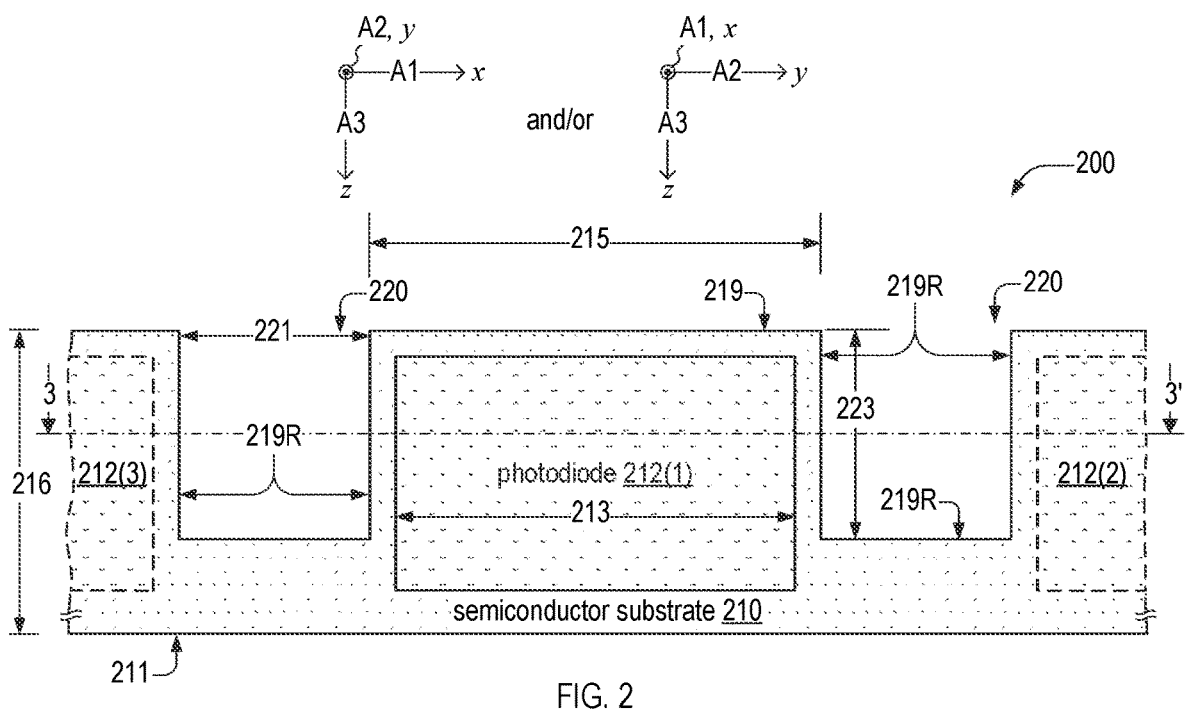
FIG. 2 is a cross-sectional schematic of a semiconductor substrate, in an embodiment.

FIG. 2 is a cross-sectional schematic of a semiconductor substrate 200, which may be a component of image sensor 100. The cross-section illustrated in FIG. 2 is parallel to a plane, hereinafter the x-z plane, formed by orthogonal axes A1 and A3, which are each orthogonal to an axis A2.

Herein, the x-y plane is formed by orthogonal axes A1 and A2, and planes parallel to the x-y plane are referred to as transverse planes. Unless otherwise specified, heights and depths of objects herein refer to the object's extent along axis A3. Herein, a reference to an axis x, y, or z refers to axes A1, A2, and A3 respectively. Also, herein, a horizontal plane is parallel to the x-y plane, a width refers to an object's extent along the x or y axis respectively, and a vertical direction is along the z axis.

Semiconductor substrate 210 includes a front surface 211, and a back surface 219 opposite to the front surface 211, and a photodiode region 212 between surfaces 211 and 219. Semiconductor substrate 210 has a thickness 216, which may be between two micrometers and seven micrometers. Back surface 219 has a recessed region 219R that surrounds photodiode 212(1). In embodiments, semiconductor substrate 200 includes additional photodiodes 212, shown in FIG. 2 as photodiodes 212(2) and 212(3).

Recessed region 219R forms a trench 220 in semiconductor substrate 210. Trench 220 has a width 221 in a plane, e.g., a horizontal plane, that includes at least part of back surface 219. Width 221 is in at least one of directions A1 and A2, and may be between 0.10 micrometers and 0.15 micrometers. Trench 220 has depth 223 with respect to a plane that spans trench 220 and includes at least part of back surface 219. Depth 223 may be between 1.5 micrometers and 3.0 micrometers depending on the thickness of semiconductor substrate 210.

Each photodiode region 212 has a width 213 and is at least in part located in a region of semiconductor substrate 210. This region has a width 215. Width 213 is less than or equal to width 215. Width 213 may equal width 215 to either (a) increase volume of photodiode 212 for maximizing charge accumulation capacity or (b) increase width 221 for isolation.

Figure 3:
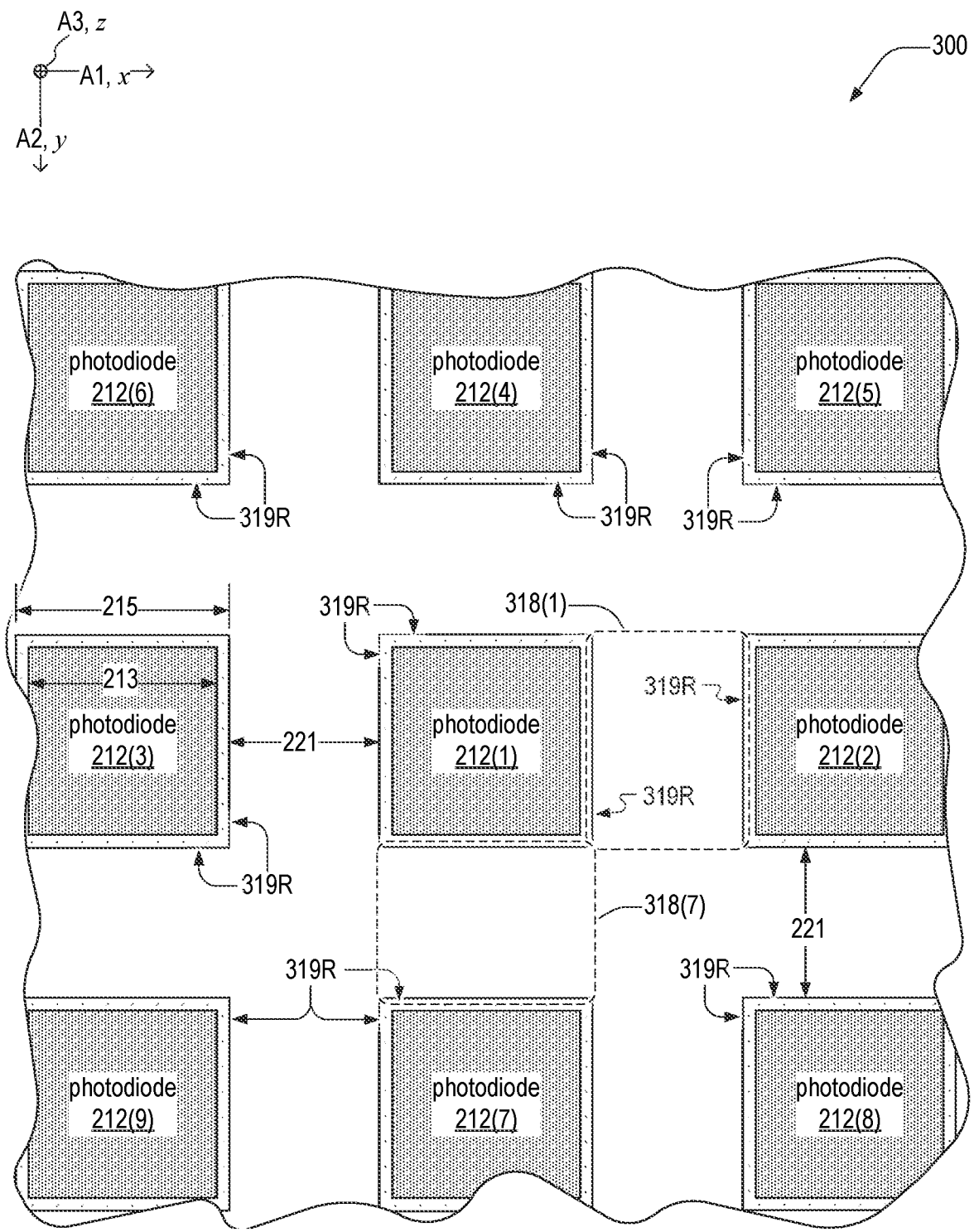
FIG. 3 is a cross-sectional schematic of a semiconductor substrate, which is an example of the semiconductor substrate of FIG. 2.

FIG. 3 is a cross-sectional schematic of a semiconductor substrate 300, which is an example of semiconductor substrate 200. The cross-sectional view of FIG. 3 is in a horizontal cross-sectional plane 3-3' shown in FIG. 2. In embodiments, cross-sectional plane 3-3' is parallel to back surface 219.

Semiconductor substrate 300 has a back surface 319 and includes an array of photodiodes 212, which includes photodiodes 212(1-9). Back surface 319 is an example of back surface 219, and includes a recessed region 319R, which is an example of recessed region 219R. Recessed region 319R forms a grid-shaped trench that separates adjacent photodiodes 212. Recessed region 319R may include, between each pair of adjacent photodiodes 212, a respective one of a plurality of recess segments that collectively form the grid-shaped trench. A width of each recess segment is width 221. For example, FIG. 3 denotes a recess segment 318(1) between photodiodes 212(1) and 212(2) and a recess segment 318(7) between photodiodes 212(1) and 212(7).

Figure 4:
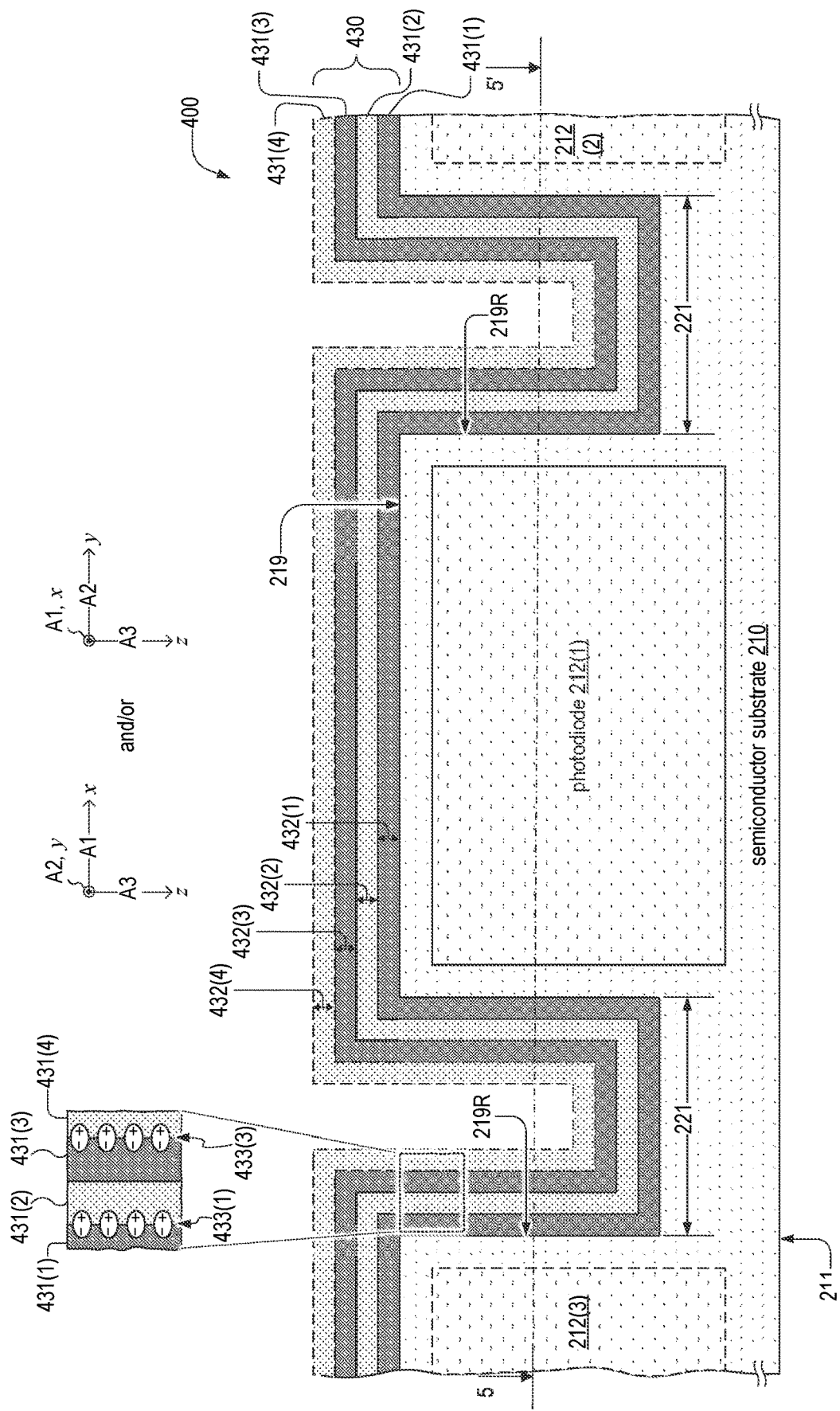
FIGS. 4 and 5 are respective cross-sectional schematics of a passivation-enhanced image sensor that includes the semiconductor substrate of FIG. 2, in an embodiment.
Figure 5:
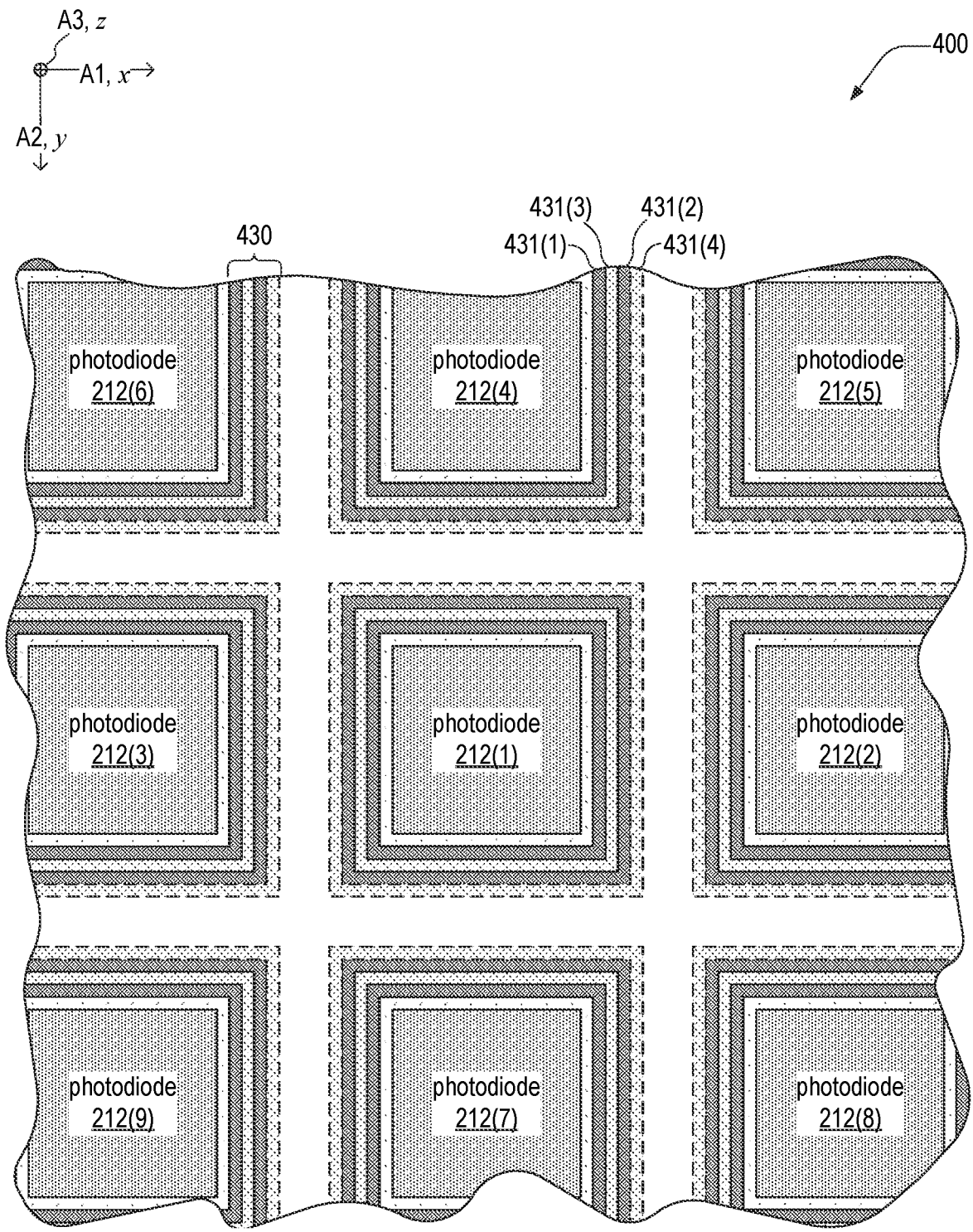

FIGS. 4 and 5 are respective cross-sectional schematics of a passivation-enhanced image sensor 400, hereinafter image sensor 400. The cross-sectional view of FIG. 5 is in a cross-sectional plane 5-5' of FIG. 4. FIGS. 4 and 5 are best illustrated together in the following description.

Image sensor 400 includes semiconductor substrate 210 and a multilayer film 430. Multilayer film 430 is on, and conformal to, recessed region 219R, and includes a plurality of high-κ material layers 431. High-κ material layers 431 includes layers 431(1-3) and, in embodiments, at least one additional layer 431, such as layer 431(4) shown in FIG. 4. Each high-κ material layer 431 may be formed of one of aluminum oxide, hafnium dioxide, zirconium dioxide, tantalum pentoxide, and gallium oxide.

Multilayer film 430 may extend from recessed region 219R such that part of multilayer film 430 is above part of back surface 219 that is at least one of (a) parallel to front surface 211, (b) adjacent to recessed region 219R, and (c) above a photodiode 212.

Adjacent material layers 431 may be categorized as belonging to one of N layer-groups of adjacent high-κ material layers 431, where layer-count N is a positive integer. In embodiments, layer-count N is the total number of layer-groups of multilayer film 430.

Each pair of adjacent high-κ material layers 431 of a same layer-group of the N layer-groups includes (i) an outer-layer and (ii) an inner-layer located between the outer-layer and recessed region 219R. Restated, the distance between the inner-layer and the recessed region 219R is less than the distance between the outer-layer and the recessed region 219R. The outer-layer and the inner-layer have an outer fixed-charge density $\rho_O$ and an inner fixed-charge density $\rho_I$, respectively. Each of the outer and the inner fixed-charge density is negative. The inner fixed-charge density is more negative than the outer fixed-charge density ($|\rho_I|>|\rho_O|$), which enhances passivation at recessed region 219R via formation of the aforementioned dipoles at interfaces of adjacent layers 431. Denoting respective charge densities of layers 431(1-4) as $\rho_1$, $\rho_2$, $\rho_3$, and $\rho_4$, respectively, each of $\rho_{1\text{-}4}$ is negative.

In embodiments, inner fixed-charge density $\rho_I$, exceeds outer fixed-charge density $\rho_O$ by a factor of at least two ($\rho_I/\rho_O \geq 2$) to ensure adequate passivation. For improve passivation, $\rho_I/\rho_O$ may be at least five.

The charge density differences between the inner-layer and the outer-layer allows the formation of interface dipoles having specific orientation with the dipole's negative charge toward substrate-trench interface and its positive charge toward the outer-layer. This orientation reduces barrier height between semiconductor substrate 210 and recess region 219R, which (i) enables electron tunneling and (ii) yields a hole-rich region proximate to substrate-trench interface, thereby enhancing passivation of defects and traps induced by plasma etching damage on trench sidewall surface.

For example, FIG. 4 illustrates dipoles 433(1) formed at the interface of layers 431(1) and 431(2), and dipoles 433(3) formed at the interface of layers 431(3) and 431(4). Dipoles 433(1) and 433(3) enable electrons, resulting from etch-damage, to move away from photodiode 212 and toward recessed region 219R. Absent said dipoles, these electrons would instead move toward photodiode 212 and result in dark current, i.e., electrons generated in absence of light.

In one embodiment, multilayer film 430 includes just one layer group (e.g., N=1) and high-κ material layers 431 includes three layers 431(1-3). The three layers 431(1-3) include two adjacent layer-pairs, each of which include layer 431(2). The first layer-pair includes layer 431(1) as the inner layer and layer 431(2) as the outer layer, where charge density $\rho_1$ is more negative than charge density $\rho_2$: $|\rho_1|>|\rho_2|$. The second layer-pair includes layer 431(2) as the inner layer and layer 431(3) as the outer layer, where charge density $\rho_2$ is more negative than charge density $\rho_3$: $|\rho_2|>|\rho_3|$. Accordingly, the negativity of charge densities of layers 431(1-3) increases as a function of the layer's proximity to recessed region 319R: $|\rho_1|>|\rho_2|>|\rho_3|$. When layers 431 include layer 431(4), layers 431 include a third layer-pair. This third layer-pair includes layer 431(3) as the inner layer and layer 431(4) as the outer layer, where charge density $\rho_3$ is more negative than charge density $\rho_4$: $[\rho_3|>|\rho_4]$.

In embodiments, multilayer film 430 includes at least two layer-groups (e.g., N=2), and a total number of adjacent high-κ material layers of each layer-group is greater than or equal to two. For example, the first layer-group includes layers 431(1,2), where $|\rho_1|>|\rho_2|$, and the second layer-group includes layers 431(3,4), where $|\rho_3|>|\rho_4|$. In this embodiment, layers 431(2) and 431(3) are in different layer-groups, and hence need not qualify as a layer-pair. Therefore, charge density $\rho_2$ of layer 431(2) may be, but need not be, more negative than charge density $\rho_3$ of layer 431(3). For example, charge densities $\rho_2$ and $\rho_3$ may be equal, or charge density $\rho_2$ of layer 431(2) may be less negative than charge density $\rho_3$: $|\rho_3|>|\rho_2|$.

Layers 431(1-4) have respective thicknesses 432(1-4). Each of thicknesses 432 may exceed three nanometers to ensure sufficient fixed charge to form a dipole at the interface between adjacent layers 431 (e.g., between layers 431(1) and 431(2), between layers 431(2) and 431(3), between layers 431(3) and 431(4). In embodiments, a total thickness of multilayer film 430 is less than one-half of trench width 221 to ensure that multilayer film 430 does not completely fill trench 220, such that trench 220 may accommodate at least one of an anti-reflective coating and a dielectric filling material, such as an oxide. To this end, each of thicknesses 432 may be less than thirty nanometers. In embodiments, a total thickness of multilayer film 430 equals one-half of trench width 221, such that multilayer film 430 fills trench 220. For example, when trench width 221 is 0.15 micrometers, a total thickness of multilayer film 430 is seventy-five nanometers.

Each of the N layer-groups may be a layer-pair such that each of the N layer-groups includes a single pair of adjacent high-material layers 431, where the inner layer and the outer layer have a respective first thickness and a second thickness. The first thickness and the second thickness may be equal. The first thickness may exceed the second thickness, which increase the strength of dipoles 433 and ensures that their associated dipole moments point away from recessed region 219R. The first thickness may exceed the second thickness by a factor that is between 1.5 and 2.0. Given appropriate differences in charge densities of the inner-layer and the outer-layer, this range is sufficient for ensuring the preferred dipole direction while not occupying excess volume within trench 420.

In one embodiment, multilayer film 430 includes two layer-groups: the first layer-group includes only layers 431 (1,2), where $|\rho_1|>|\rho_2|$, and the second layer-group includes only layers 431(3,4), where $|\rho_3|>|\rho_4|$. In this embodiment, thickness 432(1) exceeds thickness 432(2), and thickness 432(3) exceeds thickness 432(4).

In embodiments, multilayer film 430 includes layers 431(1-3), which form two layer-groups. The first layer-group includes only layers 431(1,2), where $|\rho_1|>|\rho_2|$, and the second layer-group includes only layers 431(2,3), where $|\rho_2|>|\rho_3|$. In such embodiments, thickness 432(1) exceeds thickness 432(2), thickness 432(2) exceeds thickness 432 (3), and multilayer film 430 may or may not include layer 431(4).

When multilayer film 430 includes two layer-groups, the "outer" layer-group, located further from recessed region 219R may have a first total thickness that exceeds a second total thickness than the "inner" layer group most proximate recessed region 219R. Since the outer layer-group is further from recessed region 219R, generating a same or comparable passivation effect with the outer layer-group as with the inner layer-group may require a larger dipole moment in the outer layer-group than the one formed in the inner layer-group. In embodiments, the first layer-group includes layers 431(1,2), and the second layer-group includes layers 431(3,4), where the sum of thicknesses 432(3) and 432(4) exceeds the sum of thicknesses 432(1) and 432(2).

In embodiments, and for the same passivation motivations, the ratio $r_{34}$ of thicknesses 432(3) to 432(4) exceeds the ratio $r_{12}$ of thicknesses 432(1) to 432(2). For example, ratio $r_{34}$ may exceed ratio $r_{12}$ by a factor that is less than or equal to two.

Figure 8:
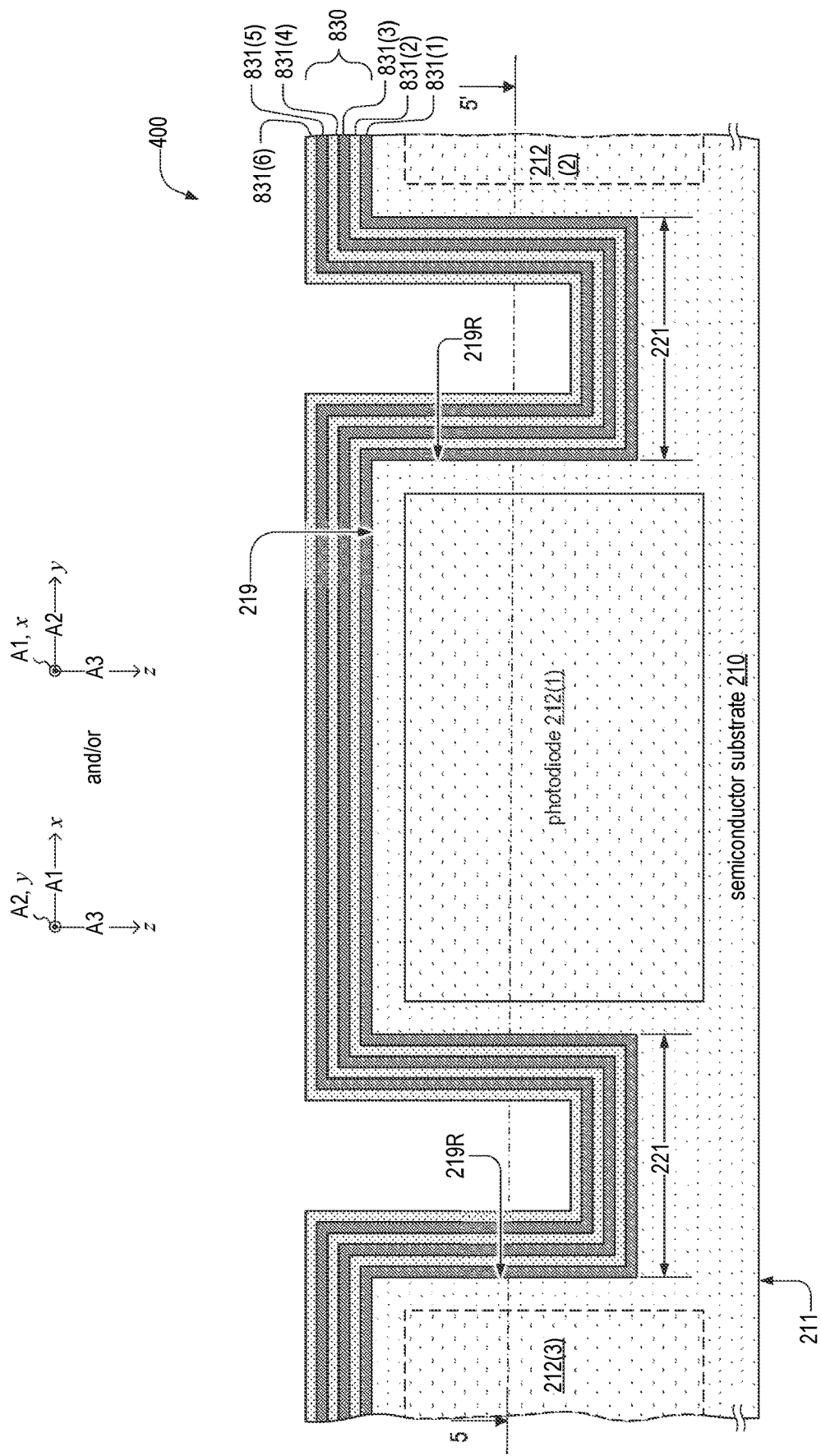
FIG. 8 is a cross-sectional schematic of a passivation-enhanced image sensor that includes the semiconductor substrate of FIG. 2, in an embodiment.

When multilayer film 430 includes two layer-groups, multilayer film 430 may include a third layer-group, adjacent to the second layer-group, that has a third total thickness. For the above-stated passivation motivations, the third total thickness may exceed the second total thickness. For example, when the second layer-group includes layers 431 (3) and 431(4), multilayer film 430 may include an additional layer group on layer 431(4), where the third total thickness of the additional layer group exceeds the sum of thicknesses 432(3) and 432(4). FIG. 8 illustrates layers 831(5,6) which together are an example of such an additional layer group.

In embodiments, one of the N layer-groups of multilayer film 430 is a layer-pair, where the pair's inner layer is formed of aluminum oxide and the pair's outer layer is formed of hafnium dioxide. This layer-pair may be layers 431(1,2), where the inner layer and outer layer are layers 431(1) and 432(2) respectively. Additionally or alternatively, this layer-pair may be layers 431(3,4), where the inner layer and outer layer are layers 431(3) and 432(4) respectively.

Each of the N layer-groups of multilayer film 430 may be a respective single pair of adjacent high-κ material layers, where N is at least two, and the pair's inner-layer is formed of aluminum oxide, and the pair's outer-layer is formed of hafnium oxide. For example, each of layers 431(1) and 432(3) may be formed of aluminum oxide, and each of layers 431(2) and 431(4) may be formed of hafnium oxide.

In embodiments, the N layer-groups of multilayer film 430 includes (i) a first layer-pair, its inner-layer and outer-layer being formed of a first material and a second material respectively, and (ii) a second layer-pair on the first layer-pair, its inner-layer and outer-layer being formed of a third material and a fourth material respectively. At least one of (i) the third material differs from the first material and (ii) the fourth material differs from the second material. The first layer-pair may be layers 431(1,2), where the inner layer and outer layer are layers 431(1) and 432(2) respectively. The second layer-pair may be layers 431(3,4), where the inner layer and outer layer are layers 431(3) and 432(4) respectively.

Figure 6:
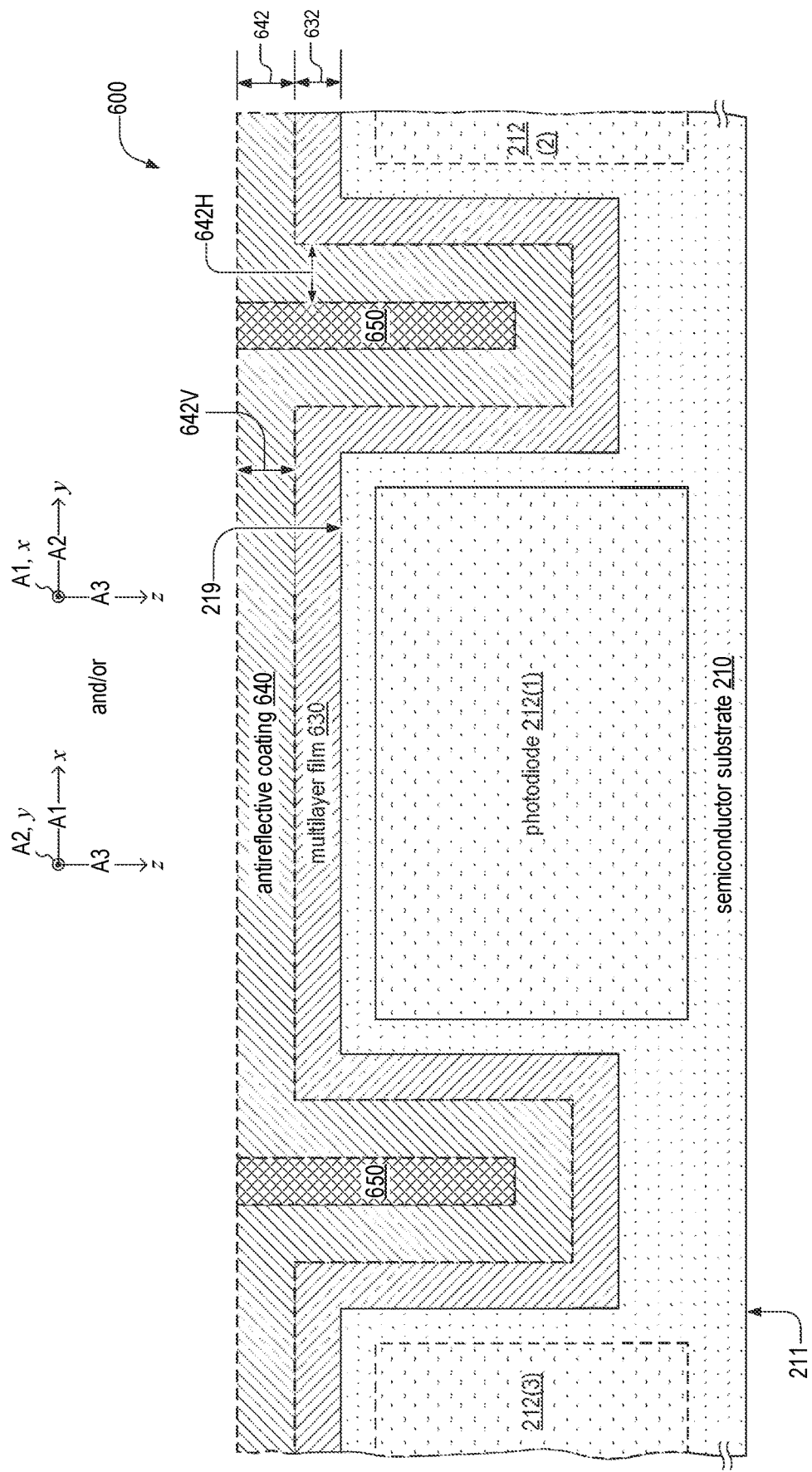
FIG. 6 is a cross-sectional schematic of an image sensor, which is an example of the image sensor of FIGS. 4 and 5.

FIG. 6 is a cross-sectional schematic of an image sensor 600, which is an example of image sensor 400 that includes a multilayer film 630 and at least one of an anti-reflective coating 640 and a dielectric 650. Multilayer film 630 is an example of multilayer film 430, where each layer in the multilayer film 630 is a continuous layer that extends from recessed region 219R onto back surface 219, and covers light sensing area of photodiodes 212.

Anti-reflective coating 640 is a continuous layer lining recess region 219R and on back surface 219, and covering light sensing area of photodiodes 212 and increases light transmitted to photodiodes 212. Dielectric 650 fills trench 220, and electrically and optically isolates adjacent photodiodes 212. Dielectric 650 may include silicon oxide or dielectric material having refractive index lower than that of the semiconductor substrate 210 for inducing total internal reflection. Anti-reflective coating 640 is on multilayer film 630 on both recessed region 219R and on backside surface of semiconductor substrate 210. Dielectric 650 fills trench 220 such that multilayer film 630 is between dielectric 650 and semiconductor substrate 210.

Multilayer film 630 and anti-reflective coating 640 have respective thicknesses 632 and 642. Thickness 642 may exceed thickness 632. In embodiments thickness 642 is uniform, however in other embodiments, thickness 642 is non-uniform such that anti-reflective coating 640 has a vertical thickness 642V in direction A3. and, in at least one of directions A1 and A2 (adjacent to recessed regions 219R), a horizontal thickness 642H.

When thickness 642 is non-uniform, horizontal thickness 642H may be less than vertical thickness 642V. A benefit of this thickness difference is, for the thicker region, to achieve a desired transmission coefficient while accommodating, with the thinner region, sufficient spacing to including required number of layer-group and number of layers in each layer-group for multilayer film 630. In such embodiments, thickness 632 may both exceed horizontal thickness 642H and be less than vertical thickness 642V. Alternatively, thickness 642 of part of anti-reflective coating 640 on the back surface 219 may exceed thickness 632 of part of multilayer film 630 on the back surface 219, while thickness 642 of part of anti-reflective coating 640 adjacent to recessed region 219R may be less than thickness 632 of part of multilayer film 630 adjacent to recessed region 219R.

Figure 7:
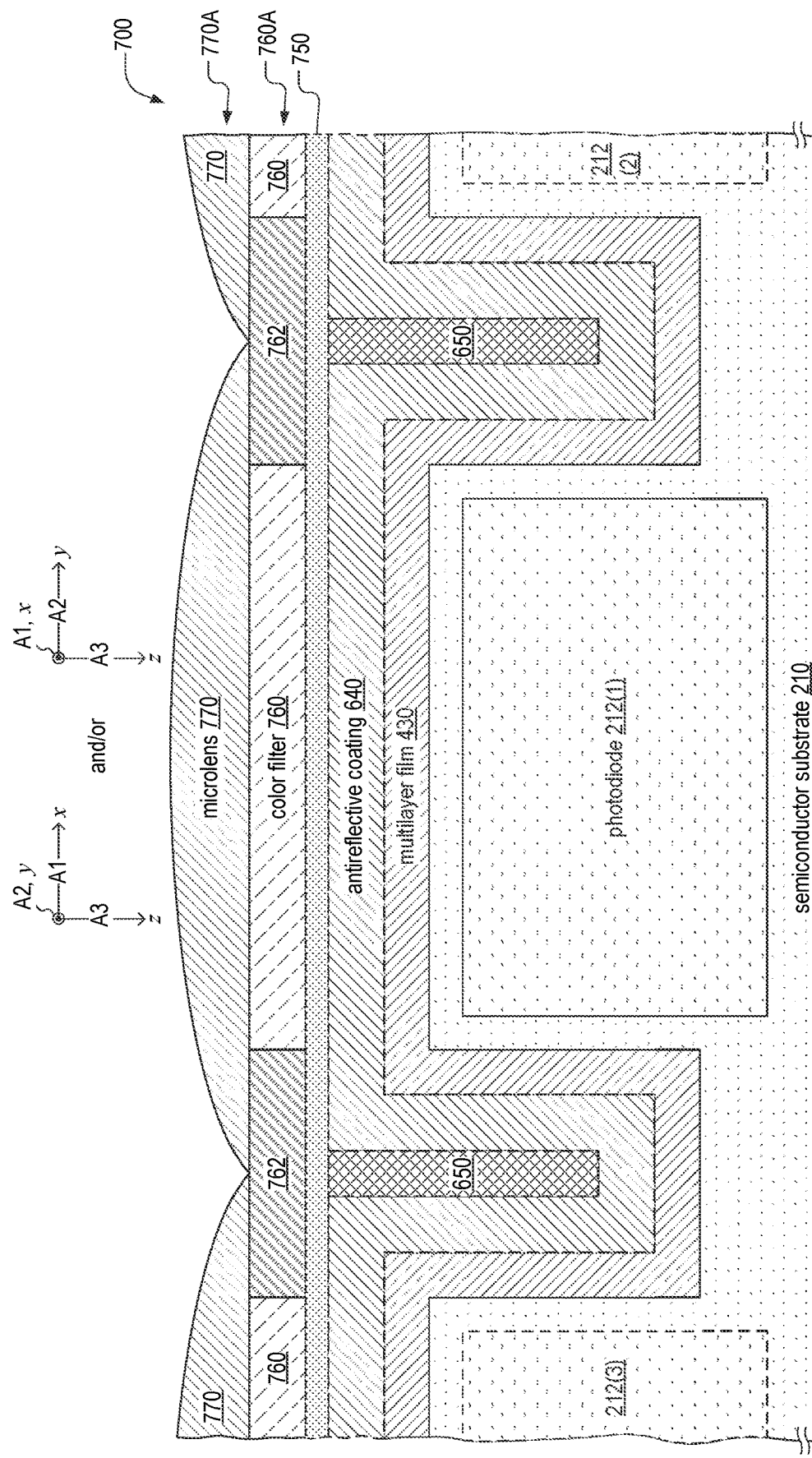
FIG. 7 is a cross-sectional schematic of an embodiment image sensor of FIGS. 4 and 5 that includes a metal grid, a color filter array, and a microlens array.

FIG. 7 is a schematic cross-sectional view of a dark-current-inhibiting image sensor 700, which is image sensor 400 with the addition of a metal grid 762, a color filter array 760A, and a microlens array 770A. Image sensor 700 includes at least one of anti-reflective coating 640 and dielectric 650.

Metal grid 752 is aligned to recessed region 219R, and to dielectric 650 when present, defines a plurality of apertures each aligned to a respective photodiode 212. Color filter array 760A includes a plurality of color filters 760, each of which is aligned to a respective photodiode 212 and is within a respective aperture of metal grid 762. Metal grid 752 separates adjacent color filters 760. Each color filter 760 may be one of a red, blue, green, cyan, magenta, yellow, infrared, or panchromatic color filter. Microlens array 770A includes a plurality of microlenses 770, each of which is disposed on a respective color filter 760 for directing incident light (e.g., light transmitted through an imaging lens) toward respective photodiode 212.

Image sensor 700 may include a buffer layer 750 between multilayer film 430 and a plane that includes both metal grid 762. Buffer layer 750 is also between color filter array 760A and multilayer film 430, as metal grid 762. When image sensor 700 includes both antireflective coating 640 and buffer layer 750, buffer layer 750 is between antireflective coating 640 and color filter array 760A. Buffer layer 750 may be formed of an oxide, and separates metal grid 762 from antireflective coating 640 and provides a flat surface for processing (material deposition and etching) of metal grid 762 and color filter array 760A.

FIG. 8 is a cross-sectional schematics of a passivation-enhanced image sensor 800, hereinafter image sensor 800. Image sensor 800 is an example of image sensor 400 that includes a multilayer film 830. Multilayer film 830 is an example of multilayer film 430, and includes layers 831(1-6), each of which is an example of a layer 431. Layers 831(1-4) are examples of layers 431(1-4), respectively, with respective charge densities denoted by $\rho_{1-4}$ as in multilayer film 430. Layers 831(5) and 831(6) have respective charge densities $\rho_5$ and $\rho_6$, each of which are negative.

In embodiments, at least one of (i) $|\rho_4|$ exceeds $|\rho_5|$ and (ii) $|\rho_5|$ exceeds $|\rho_6|$, which enhances passivation at recessed region 219R, as described above. In embodiments, both $|\rho_1|>|\rho_2|>|\rho_3|$ and $|\rho_4|>|\rho_5|>|\rho_6|$, such that multilayer film 830 includes two layer-groups: a first group that includes layers 831(1-3), and a second group that includes layers 831(4-6). Each of charge densities $\rho_4$, $\rho_5$, and $\rho_6$ may be equal to $\rho_1$, $\rho_2$, and $\rho_3$ respectively. In embodiments, $|\rho_3|>|\rho_4|$ such that the negativity of charge densities of layers 831(1-6) increases as a function of the layer's proximity to recessed region 219R: $|\rho_1|>|\rho_2|>|\rho_3|>|\rho_4|>|\rho_5|>|\rho_6|$.

At least one property of layers 831(4,5,6), such as material, thickness, and charge density, may be identical to that of respective layer 831(1,2,3). That is, for at least one of k=1, k=2, and k=3, at least one of the following properties of layers 831(k) and 831(k+3) may be identical: material, thickness, and charge density. In embodiments, a sum of thicknesses of layers 831(4,5,6) exceeds a sum of thickness of layers 831(1,2,3).

FIG. 9 is a flowchart illustrating a surface passivation method 900. Method 900 includes step 910. Step 910 includes a multilayer film on a surface, the multilayer film including N layer-groups of adjacent high-κ material layers. Each pair of adjacent high-κ material layers of a same layer-group of the N layer-groups includes (i) an outer-layer having an outer fixed-charge density and (ii) an inner-layer, located between the outer-layer and a recessed region of the surface, and having an inner fixed-charge density. Each of the outer fixed-charge density and the inner fixed-charge density is negative. The inner fixed-charge density is more negative than the outer fixed-charge density. In an example of step 910, multilayer film 430 is deposited on recessed region 219R. Step 910 may also include depositing multilayer film 430 on part of back surface 219 that is at least one of (a) parallel to front surface 211 and (b) adjacent to recessed region 219R.

Step 910 may be performed after forming a plurality of trenches in the semiconductor substrate for isolation. Step 910 may include step 912. Step 912 includes forming a first layer-group of the N layer groups by depositing number of high-material layers into the plurality of trenches and on back surface of semiconductor substrate. The deposition process may be atomic layer deposition (ALD).

In embodiments, during the deposition of each high-κ material layer film (e.g., the deposition of each high-κ material layer 431(1-4)), hydrogen atoms are introduced or injected into the semiconductor substrate, which can stabilize dangling bonds at the silicon-oxide interface at front side of the semiconductor substrate, reduce surface defects, thereby further reduce on dark current associated with surface defects.

In embodiments of layer group having three-layer stack, step 912 includes (i) depositing a first high-material layer on the surface, (ii) depositing a second high-κ material layer directly on the first layer, and depositing a third high-κ material layer directly on the second high-κ material layer. The first and the second high-κ material layers are a first pair of adjacent high-κ material layers of the first layer-group. The second and third high-κ material layers are a second pair of adjacent high-κ material layers of the first layer-group. In an example of step 912, high-κ material layer 431(1) is deposited on recessed region 219R, high-κ material layer 431(2) is deposited directly on high-κ material layer 431(1), and high-κ material layer 431(3) is deposited directly on high-κ material layer 431(2). Layers 431(1,2,3) have respective charge densities $\rho_1<0$, $\rho_2<0$, and $\rho_3<0$. In this example, charge density $\rho_1$ is more negative than charge density $\rho_2$, charge density $\rho_2$ is more negative than charge density $\rho_3$, and therefore $|\rho_1|>|\rho_2|>|\rho_3|$. Layers 431(1-3) are therefore in a same layer group of multilayer film 430.

Step 910 may include steps 915 and 917. Step 915 includes forming a first layer-group of the N layer groups by (i) depositing a first high-κ material layer on the surface and (ii) depositing a second high-κ material layer directly on the first high-κ material layer. In an example of step 915, high-κ material layer 431(1) is deposited on recessed region 219R and high-κ material layer 431(2) is deposited directly on high-material layer 431(1). Layers 431(1,2) have respective charge densities $\rho_1<0$ and $\rho_2<0$. In this example, charge density $\rho_1$ is more negative than charge density $\rho_2$: $|\rho_1|>|\rho_2|$, such that layers 431(1,2) are in a same layer group of multilayer film 430.

Step 917 includes forming a second layer-group of the N layer groups by (i) depositing a third high-κ material layer on the second high-κ material layer and (ii) depositing a fourth high-κ material layer directly on the third high-κ material layer. In an example of step 917, high-κ material layer 431(3) is deposited on high-κ material layer 431(2) and high-κ material layer 431(4) is deposited directly on high-κ material layer 431(3). Layers 431(3,4) have respective charge densities $\rho_3<0$ and $\rho_4<0$. In this example, charge density $\Sigma_3$ is more negative than charge density $\rho_3$: $|\rho_3|>|\rho_4|$, such that layers 431(3,4) are in a same layer group of multilayer film 430.

In embodiments, after step 917, an antireflective coating material is deposited into the plurality of trenches and on back surface of the semiconductor substrate forming an anti-reflective coating layer. For example, anti-reflective coating 640 is deposited on multilayer film 430, including parts of multilayer film 430 on surface 219 and on recess region 219R of semiconductor substrate 210. Thereafter, a dielectric filling material (e.g., oxide-based material) is deposited and fills each of the plurality of trenches. For example, dielectric 650 is deposited on recess region 219R and fills trench 220. In one embodiment, dielectric filling material is deposited into trenches 220 and on back surface 219 of semiconductor substrate 210 to form buffer layer 750. In such embodiment, a chemical polishing process may be applied to planarize buffer layer 750 for subsequent formation of metal grid 762, color filter array 760A, and a microlens array 770A.

Combinations of Features

Features described above as well as those claimed below may be combined in various ways without departing from the scope hereof. The following enumerated examples illustrate some possible, non-limiting combinations (A1) An image sensor includes a semiconductor substrate and a multilayer film. The semiconductor substrate includes a photodiode and a back surface having a recessed region that surrounds the photodiode. The multilayer film is on, and conformal to, the recessed region, and includes N layer-groups of adjacent high-κ material layers. Each pair of adjacent high-κ material layers of a same layer-group of the N layer-groups includes (i) an outer-layer having an outer fixed-charge density and (ii) an inner-layer, located between the outer-layer and the recessed region, that has an inner fixed-charge density. Each of the outer and inner fixed-charge density is negative. The inner fixed-charge density is more negative than the outer fixed-charge density.

(A2) In embodiments of image sensor (A1), N equals one, and a total number of adjacent high-κ material layers is greater than or equal to three.

(A3) In embodiments of image sensor (A1), N equals two, and a total number of adjacent high-κ material layers of each layer-group is greater than or equal to two.

(A4) In embodiments of any one of image sensors (A1)-(A3), each of the N layer-groups is a layer-pair such that each of the N layer-groups includes a single pair of adjacent high-κ material layers. The inner-layer has a first thickness that exceeds a second thickness of the outer-layer.

(A5) In embodiments of any one of image sensors (A1)-(A4), a respective thickness of each high-κ material layer is between three nanometers and thirty nanometers.

(A6) In embodiments of any one of image sensors (A1)-(A5), each high-κ material layer is formed of one of aluminum oxide, hafnium dioxide, zirconium dioxide, tantalum pentoxide, and gallium oxide.

(A7) In embodiments of any one of image sensors (A1)-(A6), the N layer-groups include (i) a first layer-group having a first total thickness and (ii) a second layer-group, adjacent to the first layer-group, having a second total thickness that exceeds the first total thickness. The first layer-group is between the recessed region and the second layer-group.

(A8) In embodiments of image sensor (A7), each of the first layer-group and the second layer-group is a layer-pair and having a respective first layer and a respective second layer thereon. The first layer-group has a first ratio of thicknesses of its first layer to its second layer. The second layer-group has a second ratio of thicknesses of its first layer to its second layer that is greater than or equal to the first ratio.

(A9) In embodiments of either one of image sensors (A7) and (A8), the second total thickness exceeds the first total thickness by a factor that is less than or equal to two.

(A10) In embodiments of any one of image sensors (A7)-(A9), the N layer-groups includes a third layer-group, adjacent to the second layer-group, having a third total thickness that exceeds the second total thickness.

(A11) In embodiments of any one of image sensors (A1)-(A10), one of the N layer-groups is a layer-pair, its inner layer being formed of aluminum oxide and its outer layer being formed of hafnium dioxide.

(A12) In embodiments of any one of image sensors (A1)-(A11), each of the N layer-groups is a single pair of adjacent high-κ material layers, its inner-layer being formed of aluminum oxide, its outer-layer being formed of hafnium oxide.

(A13) In embodiments of any one of image sensors (A1)-(A12), the N layer-groups including: (a) a first layer-pair, its inner-layer and outer-layer being formed of a first material and a second material respectively; and (b) a second layer-pair on the first layer-pair, its inner-layer and outer-layer being formed of a third material and a fourth material respectively. At least one of (i) the third material differs from the first material and (ii) the fourth material differs from the second material.

(A14) In embodiments of any one of image sensors (A1)-(A13), the multilayer film includes an above-trench region on a region of the back surface adjacent to part of the recessed region.

(A15) Embodiments of any one of image sensors (A1)-(A14) further include an anti-reflective coating on the multilayer film.

(A16) In embodiments of image sensors (A15), a total thickness of the anti-reflective coating exceeds a total thickness of the multilayer film.

(A17) Embodiments of any one of image sensors (A1)-(A16) further include, when the recessed region forms a trench that surrounds the photodiode, a dielectric filling the trench, such that the multilayer film is between the dielectric and the semiconductor substrate.

(A18) In embodiments of any one of image sensors (A1)-(A17), the semiconductor substrate further includes an array of photodiodes that includes the photodiode. The recessed region forms a grid-shaped trench separating each of the photodiodes of the array of photodiodes. The multilayer film conformally lines at least part of the grid-shaped trench.

(A19) In embodiments of image sensor (A18), the recess region including, between each pair of adjacent photodiodes of the array of photodiodes, a respective one of a plurality of recess segments that collectively form the grid-shaped trench.

(A20) In embodiments of image sensor (A19) a width of each of the plurality of recess segments is between 0.10 micrometers and 0.15 micrometers in a cross-sectional plane that intersects each photodiode of the array of photodiodes.

(A21) In embodiments of any one of image sensors (A1)-(A20), a thickness of the semiconductor substrate is between two micrometers and seven micrometers. A depth of the recessed region is between 1.5 micrometers and three micrometers.

(B1) A surface passivation method includes depositing, on a surface, any one of multilayer films (A1)-(A20).

(B2) In embodiments of method (B1), depositing the multilayer film includes: forming a first layer-group of the N layer-groups by (i) depositing a first high-κ material layer on the surface, (ii) depositing a second high-κ material layer directly on the first layer, and (iii) depositing a third high-material layer directly on the second high-κ material layer. The first and the second high-material layers are a first pair of adjacent high-κ material layers of the first layer-group. The second and third high-κ material layers are a second pair of adjacent high-κ material layers of the first layer-group.

(B3) In embodiments of method (B1), depositing the multilayer film includes: (a) forming a first layer-group of the N layer groups by (i) depositing a first high-κ material layer on the surface and (ii) depositing a second high-κ material layer directly on the first high-κ material layer; and (b) forming a second layer-group of the N layer groups by (i) depositing a third high-κ material layer on the second high-κ material layer and (ii) depositing a fourth high-κ material layer directly on the third high-κ material layer.

(B4) In embodiments of any one of methods (B1)-(B3), the surface is a substrate surface of a semiconductor substrate having a photodiode, and the substrate surface includes a recess region that defines a trench surrounding the photodiode in the semiconductor substrate. Such embodiments may further include depositing the multilayer film on the recess region and on the substrate; and filling the trench with a dielectric material, the multilayer film being between the dielectric material and the recess region.

(B5) Embodiments of method (B4) further include, prior to filling the trench, depositing an anti-reflective layer on the multilayer film and on the substrate surface, wherein a first thickness of a first portion of the anti-reflective layer on the substrate surface exceeds a second thickness of a second portion of the anti-reflective layer on the recess region.

Changes may be made in the above image sensors and surface passivation methods without departing from the scope of the present embodiments. It should thus be noted that the matter contained in the above description or shown in the accompanying drawings should be interpreted as illustrative and not in a limiting sense. Herein, and unless otherwise indicated, the phrase "in embodiments" is equivalent to the phrase "in certain embodiments," and does not refer to all embodiments. The following claims are intended to cover all generic and specific features described herein, as well as all statements of the scope of the present image sensors and surface passivation methods, which, as a matter of language, might be said to fall therebetween.

What is claimed is:

1. An image sensor comprising:
a semiconductor substrate including a photodiode and a back surface having a recessed region that surrounds the photodiode; and
a multilayer film on, and conformal to, the recessed region and including N layer-groups of adjacent high-κ material layers,
each pair of adjacent high-κ material layers of a same layer-group of the N layer-groups including (i) an outer-layer having an outer fixed-charge density and (ii) an inner-layer, located between the outer-layer and the recessed region, and having an inner fixed-charge density,
each of the outer fixed-charge density and inner fixed-charge density being negative,
the inner fixed-charge density being more negative than the outer fixed-charge density.

2. The image sensor of claim 1, N being equal to one, a total number of adjacent high-κ material layers being greater than or equal to three.

3. The image sensor of claim 1, N being equal to two and a total number of adjacent high-κ material layers of each layer-group being greater than or equal to two.

4. The image sensor of claim 1, each of the N layer-groups being a layer-pair such that each of the N layer-groups includes a single pair of adjacent high-κ material layers, the inner-layer having a first thickness that exceeds a second thickness of the outer-layer.

5. The image sensor of claim 1, a respective thickness of each high-κ material layer being between three nanometers and thirty nanometers.

6. The image sensor of claim 1, each high-κ material layer being formed of one of aluminum oxide, hafnium dioxide, zirconium dioxide, tantalum pentoxide, and gallium oxide.

7. The image sensor of claim 1, the N layer-groups including (i) a first layer-group having a first total thickness and (ii) a second layer-group, adjacent to the first layer-group, having a second total thickness that exceeds the first total thickness, the first layer-group being between the recessed region and the second layer-group.

8. The image sensor of claim 7, each of the first layer-group and the second layer-group being a layer-pair and having a respective first layer and a respective second layer thereon, the first layer-group having a first ratio of thicknesses of its first layer to its second layer, the second layer-group having a second ratio of thicknesses of its first layer to its second layer that is greater than or equal to the first ratio.

9. The image sensor of claim 7, the second total thickness exceeding the first total thickness by a factor that is less than or equal to two.

10. The image sensor of claim 7, the N layer-groups including a third layer-group, adjacent to the second layer-group, having a third total thickness that exceeds the second total thickness.

11. The image sensor of claim 1, one of the N layer-groups being a layer-pair, its inner layer being formed of aluminum oxide and its outer layer being formed of hafnium dioxide.

12. The image sensor of claim 1, each of the N layer-groups being a single pair of adjacent high-κ material layers, its inner-layer being formed of aluminum oxide, its outer-layer being formed of hafnium oxide.

13. The image sensor of claim 1, the N layer-groups including:
   a first layer-pair, its inner-layer and outer-layer being formed of a first material and a second material respectively; and
   a second layer-pair on the first layer-pair, its inner-layer and outer-layer being formed of a third material and a fourth material respectively,
   wherein at least one of (i) the third material differs from the first material and (ii) the fourth material differs from the second material.

14. The image sensor of claim 1, the multilayer film including an above-trench region on a region of the back surface adjacent to part of the recessed region.

15. The image sensor of claim 1, further comprising an anti-reflective coating on the multilayer film and on the back surface of the semiconductor substrate above the photodiode.

16. The image sensor of claim 15, a total thickness of the anti-reflective coating on the back surface exceeding a total thickness of the multilayer film.

17. The image sensor of claim 1, the recessed region forming a trench that surrounds the photodiode, further comprising a dielectric filling the trench, such that the multilayer film is between the dielectric and the semiconductor substrate.

18. The image sensor of claim 1:
   the semiconductor substrate further including an array of photodiodes that includes the photodiode, the recessed region forming a grid-shaped trench separating each of the photodiodes of the array of photodiodes; and
   the multilayer film conformally lining at least part of the grid-shaped trench.

19. The image sensor of claim 18, the recess region including, between each pair of adjacent photodiodes of the array of photodiodes, a respective one of a plurality of recess segments that collectively form the grid-shaped trench.

* * * * *